March 24, 1970 G. R. ANTELL 3,502,518

METHOD FOR PRODUCING GALLIUM ARSENIDE DEVICES

Filed Sept. 1, 1967 2 Sheets-Sheet 1

*Inventor*
GEORGE R. ANTELL
By [signature]
*Attorney*

METHOD FOR PRODUCING GALLIUM ARSENIDE DEVICES

Filed Sept. 1, 1967 2 Sheets-Sheet 2

*Inventor*
GEORGE R. ANTELL
*By* [signature]
*Attorney*

United States Patent Office 3,502,518
Patented Mar. 24, 1970

3,502,518

METHOD FOR PRODUCING GALLIUM ARSENIDE DEVICES

George Richard Antell, Essex, England, assignor to International Standard Electric Corporation, New York, N.Y., a corporation of Delaware Filed Sept. 1, 1967, Ser. No. 665,094
Claims priority, application Great Britain, Sept. 20, 1966, 41,973/66
Int. Cl. H01l 7/34
U.S. Cl. 148—186 26 Claims

ABSTRACT OF THE DISCLOSURE

The invention provides a method for producing gallium arsenide devices including the steps of providing a slice of gallium arsenide of a first conductivity, forming a layer of semi-insulating material in a major surface of the slice using oxygen, and diffusing a dopant into the major surface of the layer of insulating material to form therein a layer of gallium arsenide of desired conductivity.

DESCRIPTION OF THE INVENTION

The invention relates to a method for producing gallium arsenide devices and to devices made by the method.

The invention provides a method for producing gallium arsenide NIP devices including the steps of providing a slice of P-type gallium arsenide forming a layer of semi-insulating material in a major surface of said slice using oxygen, and diffusing a dopant into the major surface of said layer of semi-insulating material to form therein a layer of gallium arsenide of N-type conductivity.

The invention also provides a method for producing gallium arsenide PIN devices including the steps of providing a slice of N-type gallium arsenide, diffusing a dopant into a major surface of said slice to form therein a first layer of gallium arsenide of P-type conductivity, forming said first layer into a layer of semi-insulating material using oxygen, and diffusing a dopant into the major surface of said layer of semi-insulating material to form therein a second layer of gallium arsenide of P-type conductivity.

Figure 1:
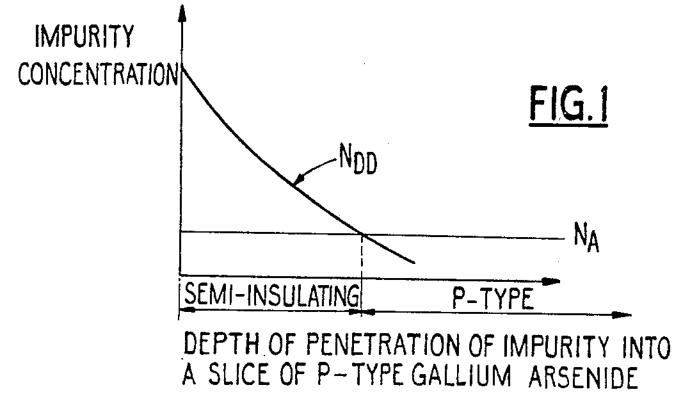
Figure 2:
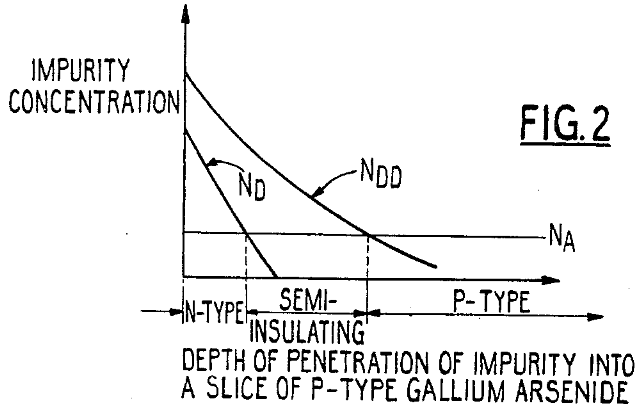
Figure 3:
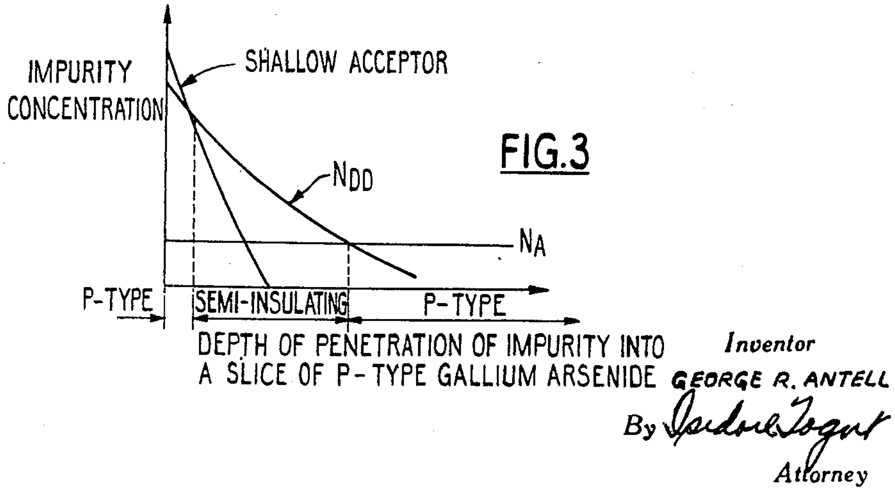
Figure 4:
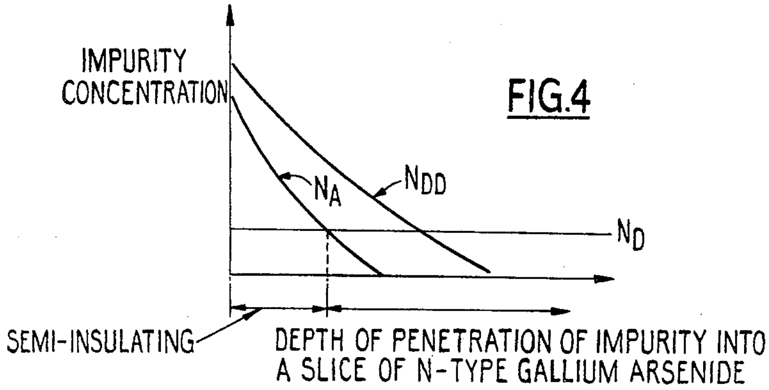
Figure 5:
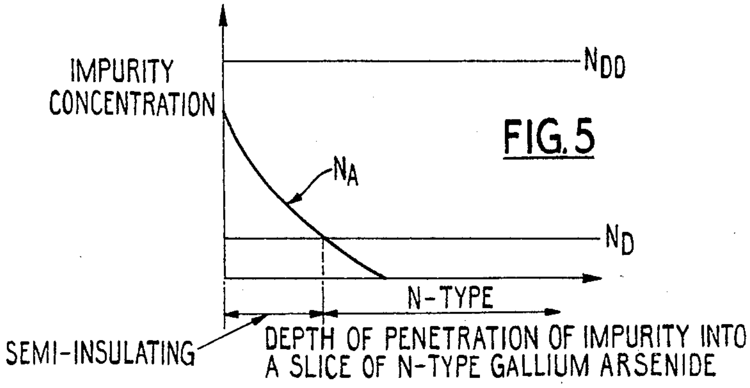
Figure 6:
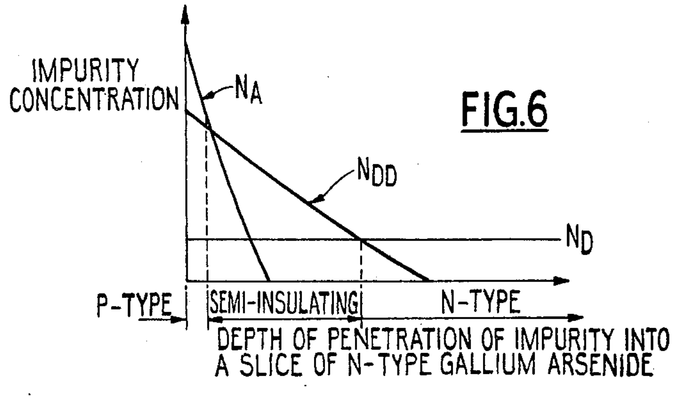

The foregoing and other features according to the invention will be understood from the following description with reference to the accompanying drawings, in which:

FIGURES 1 to 3 show curves of impurity concentration versus depth of penetration of the impurity into a slice of gallium arsenide of P-type conductivity, and FIGURES 4 to 6 show curves of impurity concentration versus depth of penetration of the impurity into a slice of gallium arsenide of N-type conductivity.

If oxygen is introduced into the surface of a lightly doped P-type slice of gallium arsenide, then a semi-insulating skin or layer will be formed where the concentration ($N_{DD}$) of the deep donor i.e. oxygen is greater than the concentration ($N_A$) of the shallow acceptor. This is illustrated in the drawing according to FIGURE 1 which shows a curve of impurity concentration versus depth of penetration of the impurity into the slice of gallium arsenide. The thickness of the semi-insulating layer is determined by the normal diffusion considerations.

The oxygen can be diffused directly into the surface of the gallium arsenide slice at a temperature of 900° C. or into the surface of the gallium arsenide slice through a protective film, for example silicon dioxide ($SiO_2$), the diffusion time being 5 to 24 hours depending on the thickness required for the insulating layer. As an example, after 16 hours the layer is 16–20 microns wide. The silicon dioxide is deposited on the surface of the slice of gallium arsenide after the surface has been lapped, polished and chemically etched.

The oxygen may be present as a gas at low pressure or mixed with argon to give a low partial pressure, as water vapor, as arsenic trioxide in the pressure of water vapor to accelerate the diffusion, or the dissociated product of gallium oxide in the pressure of water vapor. Other oxide systems that do not introduce extraneous impurities into the gallium arsenide could also be used for the oxygen diffusion process.

Alternatively, the oxygen could be introduced by ion bombardment which may be followed by a drive-in process at a higher temperature of 900° C. or it could be lodged in the surface during the deposition of a silica film by reactive sputtering followed by a diffusion process to drive it into the surface of the slice of gallium arsenide. The process involved is to sputter a silica film when it is believed that oxygen ions, present in the formation of the silica film, are also embedded in the surface of the gallium arsenide. It is this oxygen which is then diffused in, again typically at a temperature of 900° C. for 5–24 hours.

Starting with the slice of gallium arsenide having a semi-insulating skin which was produced as outlined above then an NIP gallium arsenide device may be produced by diffusing an N-type dopant into the semi-insulating skin. A shallow layer of gallium arsenide of N-type conductivity will be formed where the concentration ($N_D$) of the shallow donor is greater than the concentration ($N_A$) of the shallow acceptor. The layer of semi-insulating material will be formed when the concentration ($N_{DD}$) of the deep donor, i.e. oxygen is greater than the concentration $N_A$ and where the concentration $N_A$ is greater than $N_D$ but less than $N_{DD}$.

i.e. $N_{DD}>N_A>N_D$

If a P-type dopant, for example zinc is diffused into the layer of semi-insulating mateiral instead of the N-type dopant then a PIP gallium arsenide device would be obtained. In this case the surface concentration of the P-type dopant must be greater than $N_D+N_{DD}$ to ensure over doping. This is illustrated in the drawing according to FIGURE 3.

If an N-type dopant, such as tin, is now diffused in sufficient concentration to obtain a shallow heavily doped N+ layer, this provides an N+PIN gallium arsenide device.

The slice of gallium arsenide of P-type conductivity which is used to produce the devices outlined in the preceding paragraphs may be formed by epitaxial growth on a P+-type, N-type, or N+-type substrate thereby giving rise to NIPP+, PIPN, PIPN+ etc. gallium arsenide devices.

If oxygen and a P-type dopant are introduced into a slice of gallium arsenide of N-type conductivity such that $N_{DD}>N_A>N_D$ then a layer of semi-insulating material will be formed. This is illustrated in the drawing according to FIGURE 4 which shows curves of impurity concentration versus depth of penetration of the impurity into a slice of gallium arsenide of N-type conductivity.

If the slice of gallium arsenide of N-type conductivity has been grown such that it contains oxygen and the concentration ($N_{DD}$) of the oxygen is greater than the concentration ($N_D$) of the shallow donor then the diffusion of a P-type dopant into this crystal would give a layer of semi-insulating material providing $N_{DD}>N_A>N_D$. This is illustrated in the drawing according to FIGURE 5.

Starting with the slice of gallium arsenide of N-type conductivity a PIN gallium arsenide device may be produced by diffusing oxygen and a P-type dopant into the slice of gallium arsenide either consecutively or simultaneously, for example, from a zinc doped silica layer formed in the surface of the slice in an oxidizing atmosphere. The structure of this device is illustrated in the drawing according to FIGURE 6 where it can be seen that a layer of gallium arsenide of P-type conductivity is formed when the concentration ($N_A$) of the shallow acceptor i.e. the P-type dopant is greater than the concentration ($N_{DD}$) of the oxygen plus the concentration ($N_D$) of the shallow donor and a layer of semi-insulating material is formed when $N_{DD}>N_A>N_D$.

If an N-type dopant, such as tin, is now diffused in sufficient concentration to obtain a shallow heavily doped N+ layer, this provides an N+PIN gallium arsenide device.

The slice of gallium arsenide of N-type conductivity may be formed by epitaxial growth of an N-type, P-type, N+-type or P+-type substrate thereby extending the range of devices that may be produced from gallium arsenide of N-type conductivity.

A transistor was made in accordance with the principles of this invention. The starting material for the transistor was epitaxial slice having a substrate of $2\times10^{18}$ N-type and an epitaxial layer of $(1-5)\times10^{16}$ N-type and about 25 $\mu$ m. thick. The slice was degreased, soaked in 10% potassium cyanide and washed thoroughly in demineralized water. A zinc-doped silica film 1200 A. thick was deposited on the slice by reactive sputtering in a high purity system.

The silica film was thickened up to about 4000 A. by depositing extra silica using the silane-oxygen process. The slice was then diffused in Spectrosil quartz for 5 hours at 900° C. and the zinc penetrated to a depth of 3–4 $\mu$ m. Emitter windows, 0.6 thou $\times$3 thou, were opened up in the silica mask and tin was diffused in for an hour at 950° C. under 1 atm. pressure of arsenic.

Gold-tin was used as the emitter contact and gold-zinc as the base contact. Both layers of gold were about 300 A. thick and the emitter contact was protected from the gold-zinc of the base contact by a 1000 A. film of aluminium. Expanded contacts were prepared using aluminum and the units were scribed and mounted on headers.

It is to be understood that the foregoing description of specific examples of this invention is made by way of example only and is not to be considered as a limitation on its scope.

I claim:

1. A method for producing gallium arsenide devices comprising the steps of:

providing a slice of gallium arsenide of a first conductivity, forming a layer of semi-insulating material in a major surface of said slice by introducing oxygen therein, and diffusing a dopant into the major surface of said layer of semi-insulating material to form therein a layer of gallium arsenide of desired conductivity.

2. A method according to claim 1 wherein said first conductivity is P-type and said desired conductivity is N-type.

3. A method according to claim 1 wherein said first conductivity is P-type and said desired conductivity is P-type.

4. A method for producing gallium arsenide devices according to claim 1 wherein said layer of semi-insulating material is formed by diffusing the oxygen through a layer of silicon dioxide previously deposited on said major surface of said slice of gallium arsenide of said first conductor.

5. A method for producing gallium arsenide devices according to claim 1 wherein said layer of semi-insulating material is formed by diffusing the oxygen directly into said major surface of said slice of P-type gallium arsenide.

6. A method for producing gallium arsenide devices according to claim 1 wherein said layer of semi-insulating material is formed by incorporating the oxygen in said slice of gallium arsenide of said first conductivity by ion bombardment and then diffusing.

7. A method for producing gallium arsenide devices according to claim 1 wherein said layer of semi-insulating material is formed by causing the oxygen to be trapped in said major surface of said slice of gallium arsenide of said first conductivity during the deposition thereon of a silica film and then diffusing.

8. A method for producing gallium arsenide devices according to claim 7 wherein said silica film is deposited by reactive sputtering.

9. A method for producing gallium arsenide devices according to claim 1 wherein said oxygen is mixed with argon to give a low partial pressure.

10. A method for producing gallium arsenide devices according to claim 1 wherein said oxygen is present as either arsenic trioxide in the presence of water vapor or as the dissociated product of gallium oxide in the presence of water vapor.

11. A method for producing gallium arsenide devices according to claim 2 wherein said layer of gallium arsenide of N-type conductivity is formed when the concentration of the shallow donor is greater than the concentration of the shallow acceptor.

12. A method for producing gallium arsenide devices according to claim 2 wherein said layer of semi-insulating material is formed when the concentration of the oxygen is greater than the concentration of the shallow acceptor and when the concentration of the shallow acceptor is greater than the concentration of the shallow donor but less than the concentration of the oxygen.

13. A method for producing gallium arsenide devices according to claim 3 wherein said layer of gallium arsenide of P-type conductivity is formed when the surface concentration of said P-type diffusant is greater than the concentration of the shallow donors plus the concentration of the oxygen.

14. A method for producing gallium arsenide devices according to claim 13 comprising the additional step of diffusing into said layer of gallium arsenide of P-type conductivity a dopant to produce a heavily doped layer of gallium arsenide of N+-type conductivity.

15. A method for producing gallium arsenide devices according to claim 1 including the step of forming said slice of gallium arsenide of said first conductivity on the surface of a substrate.

16. A method for producing gallium arsenide devices according to claim 15 wherein said slice of gallium arsenide of said first conductivity is formed by epitaxial growth.

17. A method for producing gallium arsenide devices comprising the steps of:

providing a slice of gallium arsenide of a first conductivity;

diffusing a first dopant into a major surface of said slice to form therein a first layer of gallium arsenide of opposite conductivity;

forming said first layer into a layer of semi-insulating gallium arsenide by introducing oxygen therein, and diffusing a second dopant into the major surface of said layer of semi-insulating material to form therein a second layer of gallium arsenide of said opposite conductivity.

18. A method for producing gallium arsenide devices as claimed in claim 17 wherein said first dopant and the oxygen are diffused simultaneously into said major surface of said slice of gallium arsenide of said first conductivity to form therein said layer of semi-insulating gallium arsenide.

19. A method for producing gallium arsenide devices as claimed in claim 18 wherein said simultaneous diffusion process further comprises the steps of lapping, polishing and chemically etching said major surface of said slice of gallium arsenide of said first conductivity, depositing a layer of zinc doped silica on said major surface and diffusing in an oxidizing atmosphere.

20. A method for producing gallium arsenide devices as claimed in claim 17 wherein said slice of gallium arsenide of said first conductivity is grown such that it contains oxygen, the concentration of the oxygen being greater than the concentration of the shallow donor, and wherein said layer of semi-insulating material is formed when diffusing said first dopant into said major of said slice of gallium arsenide provided the concentration of said first dopant is greater than the concentration of the shallow donor but less than the concentration of the oxygen.

21. A method according to claim 17 wherein said first conductivity is N-type and said opposite conductivity is P-type.

22. A method for producing gallium arsenide devices according to claim 21 comprising the additional step of diffusing into said layer of gallium arsenide of P-type conductivity a dopant to produce a heavily doped layer of gallium arsenide of N+-type conductivity.

23. A method for producing gallium arsenide devices according to claim 22 further comprising the subsequent step of forming said slice of N-type gallium arsenide on the surface of a substrate.

24. A method for producing gallium arsenide devices as claimed in claim 23 wherein said slice of N-type gallium arsenide is formed by epitaxial growth.

25. A method for producing gallium arsenide devices in claim 23 wherein the conductivity of said substrate is either N-type, P-type, N+-type or P+-type.

26. A method for producing gallium arsenide devices as claimed in claim 17 wherein said first and second dopants are provided by zinc.

References Cited

UNITED STATES PATENTS 3,313,663 4/1967 Yeh et al. ---------- 148—187

L. DEWAYNE RUTLEDGE, Primary Examiner

R. A. LESTER, Assistant Examiner

U.S. Cl. X.R.

148—187, 188, 189, 190